(12) United States Patent
Yonezawa et al.

(10) Patent No.: US 8,319,511 B2
(45) Date of Patent: Nov. 27, 2012

(54) PROBE DEVICE HAVING A STRUCTURE FOR BEING PREVENTED FROM DEFORMING

(75) Inventors: Toshihiro Yonezawa, Nirasaki (JP); Shinichiro Takase, Nirasaki (JP)

(73) Assignee: Tokyo Electron Limited (JP)

( * ) Notice: Subject to any disclaimer, the term of this patent is extended or adjusted under 35 U.S.C. 154(b) by 297 days.

(21) Appl. No.: 12/745,306

(22) PCT Filed: Nov. 5, 2008

(86) PCT No.: PCT/JP2008/070111
§ 371 (c)(1),
(2), (4) Date: Jun. 9, 2010

(87) PCT Pub. No.: WO2009/069440
PCT Pub. Date: Jun. 4, 2009

(65) Prior Publication Data
US 2010/0301888 A1  Dec. 2, 2010

(30) Foreign Application Priority Data
Nov. 30, 2007  (JP) .................................. 2007-310109

(51) Int. Cl.
*G01R 31/00*  (2006.01)
(52) U.S. Cl. ............................. 324/756.03; 324/756.01
(58) Field of Classification Search ........................ None
See application file for complete search history.

(56) References Cited

U.S. PATENT DOCUMENTS

| | | | | |
|---|---|---|---|---|
| 6,762,612 B2 * | 7/2004 | Yu et al. | ................ | 324/750.17 |
| 7,471,078 B2 * | 12/2008 | Hobbs et al. | ............. | 324/750.16 |
| 7,733,103 B2 * | 6/2010 | Park et al. | ................ | 324/754.07 |
| 2007/0128076 A1 | 6/2007 | Bohm | | |
| 2008/0150558 A1 | 6/2008 | Amemiya et al. | | |

FOREIGN PATENT DOCUMENTS

| | | |
|---|---|---|
| JP | 04-359500 | 12/1992 |
| JP | 2006-010629 | 1/2006 |
| JP | 2007-158345 | 6/2007 |
| JP | 2007-178405 | 7/2007 |
| KR | 20-0433761 | 12/2006 |
| KR | 10-2007-0104531 | 10/2007 |
| WO | 2007/007544 | 1/2007 |

OTHER PUBLICATIONS

International Search Report—PCT/JP2008/070111 dated Jan. 20, 2009.
Korean Office Action—Korean Application No. 10-2010-7010747 issued on Jul. 27, 2011, citing KR 10-2007-0104531, JP 2007-178405, and KR 20-0433761.

* cited by examiner

*Primary Examiner* — Vinh Nguyen
(74) *Attorney, Agent, or Firm* — Cantor Colburn LLP

(57) ABSTRACT

A reinforcing member is formed at a top surface side of a probe card including a support plate for supporting a contactor and a circuit board. A plurality of long guide holes are formed in an outer peripheral portion of the reinforcing member. Fixing members fixed to a holding member and collars formed around outer circumferences of the fixing members are formed in the guide holes. A length in a longitudinal direction of each of the guide holes is greater than a diameter of each of the collars, and a central line in the longitudinal direction of each of the guide holes passes through a center of the reinforcing member. Due to the guide holes, horizontal expansion of the reinforcing member itself is allowed.

4 Claims, 9 Drawing Sheets

PROBE DEVICE HAVING A STRUCTURE FOR BEING PREVENTED FROM DEFORMING

TECHNICAL FIELD

The present invention relates to a probe device for inspecting electrical characteristics of an object to be inspected.

BACKGROUND ART

Inspection of electrical characteristics of an electronic circuit, such as an IC or an LSI, formed on, for example, a semiconductor wafer (hereinafter, referred to as a wafer) are performed by using a probe card mounted on a probe device. For example, as shown in FIG. 8, a probe device 100 includes a probe card 101, a holding stage 102 on which a wafer W is placed, and a card holder 103 for holding the probe card 101.

The probe card 101 includes a support plate 111 that is called a contactor or a guide plate for supporting a plurality of needle-shaped probes 110, and a printed wiring board 112 electrically connected to the support plate 111. The support plate 111 has a bottom surface, on which front end contact portions of the probes 110 protrude, facing the wafer W, and the printed wiring board 112 is disposed at a top surface side of the support plate 111.

A correcting member 113 for correcting the degree of flatness of the support plate 111 is formed at a top surface side of the printed wiring board 112. A reinforcing member 114 for reinforcing the printed wiring board 112 is formed at a top surface side of the correcting member 113. An outer peripheral portion of the reinforcing member 114 is fixed to the card holder 103 by bolts 115.

Inspection of electrical characteristics of a device on the wafer W is performed by bringing the front end contact portions of the plurality of probes 110 into contact with electrodes of an electronic circuit of the device and applying an electrical inspection signal to a corresponding electrode from each of the plurality of probes 110 through the printed wiring board 112, as disclosed in Patent Document 1 (Japanese Laid-Open Patent Publication No. 2006-10629).

DISCLOSURE OF THE INVENTION

Technical Problem

Since the inspection of the electrical characteristics is performed at a temperature in a wide range of, for example, −20° C. to 150° C., the reinforcing member 114 may expand in a horizontal direction due to, for example, thermal effect, at the time of inspection. However, since the outer peripheral portion of the reinforcing member 114 is fixed to the card holder 103 by the bolts 115, the reinforcing member 114 cannot expand in the horizontal direction, and thus as shown in FIG. 9, a central portion of the reinforcing member 114 may deform vertically upward. If the reinforcing member 114 deforms vertically upward, central portions of all of the correcting member 113, the printed wiring board 112, and support plate 111 fixed to the reinforcing member 114 deform vertically upward. In this case, heights of a plurality of the probes 110 supported by the support plate 111 from the wafer W become irregular. Accordingly, contact between each of the probes 110 and each of the electrodes of the wafer W at the time of inspection becomes unstable, thereby making it difficult to appropriately inspect the electrical characteristics of the wafer W.

The present invention is proposed by considering this technical problem. According to the present invention inspection of electrical characteristics may be appropriately performed by stabilizing contact between probes and an object to be inspected such as a wafer.

Technical Solution

To solve the problem, the present invention provides a probe device which inspects electrical characteristics of an object to be inspected, the probe device including: a probe card including a support plate which supports a contactor that contacts the object to be inspected, and a circuit board disposed at a top surface side of the support plate; a reinforcing member having a part which is disposed at a top surface side of the circuit board and which reinforces the circuit board; a holding member which holds an outer peripheral portion of the reinforcing member, wherein fixing members fixed to the holding member are inserted into and pass through the outer peripheral portion of the reinforcing member, a plurality of guide holes which guide horizontal extension and contraction of the reinforcing member are formed to pass through the reinforcing member in a thickness direction of the reinforcing member, a length in a longitudinal direction of each of the guide holes is greater than a diameter of each of the fixing members when viewed from a plane, and a central line in the longitudinal direction of each of the guide holes passes through a center of the reinforcing member.

According to the present invention, since the plurality of the guide holes are formed to pass through an outer peripheral portion of the reinforcing member in a thickness direction of the reinforcing member, and a length in a longitudinal direction of each of the guide holes is greater than a diameter of each of the fixing members inserted into the guide holes, horizontal expansion of the reinforcing member itself is allowed. Accordingly, at the time of inspecting electrical characteristics of an object to be inspected, even though the temperature of the reinforcing member is increased, the reinforcing member can expand in a horizontal direction, thereby suppressing vertical deformation of the reinforcing member. Also, in this case, a central line in the longitudinal direction of each of the guide holes passes through a center of the reinforcing member, the reinforcing member can smoothly expand outwardly from its center. Since vertical deformation of the reinforcing member is suppressed in this way, vertical deformation of a support plate formed under the reinforcing member can also be suppressed. Accordingly, since heights of a plurality of contactors supported by the support plate can be constantly maintained at predetermined heights, contact between the contactors and the object to be inspected at the time of inspection can be stabilized, thereby enabling to appropriately inspect electrical characteristics of the object to be inspected.

Advantageous Effects

According to the present invention, since contact between probes and an object to be inspected is stabilized, inspection with high precision and high reliability can be performed.

BEST MODE FOR CARRYING OUT THE INVENTION

Figure 1:
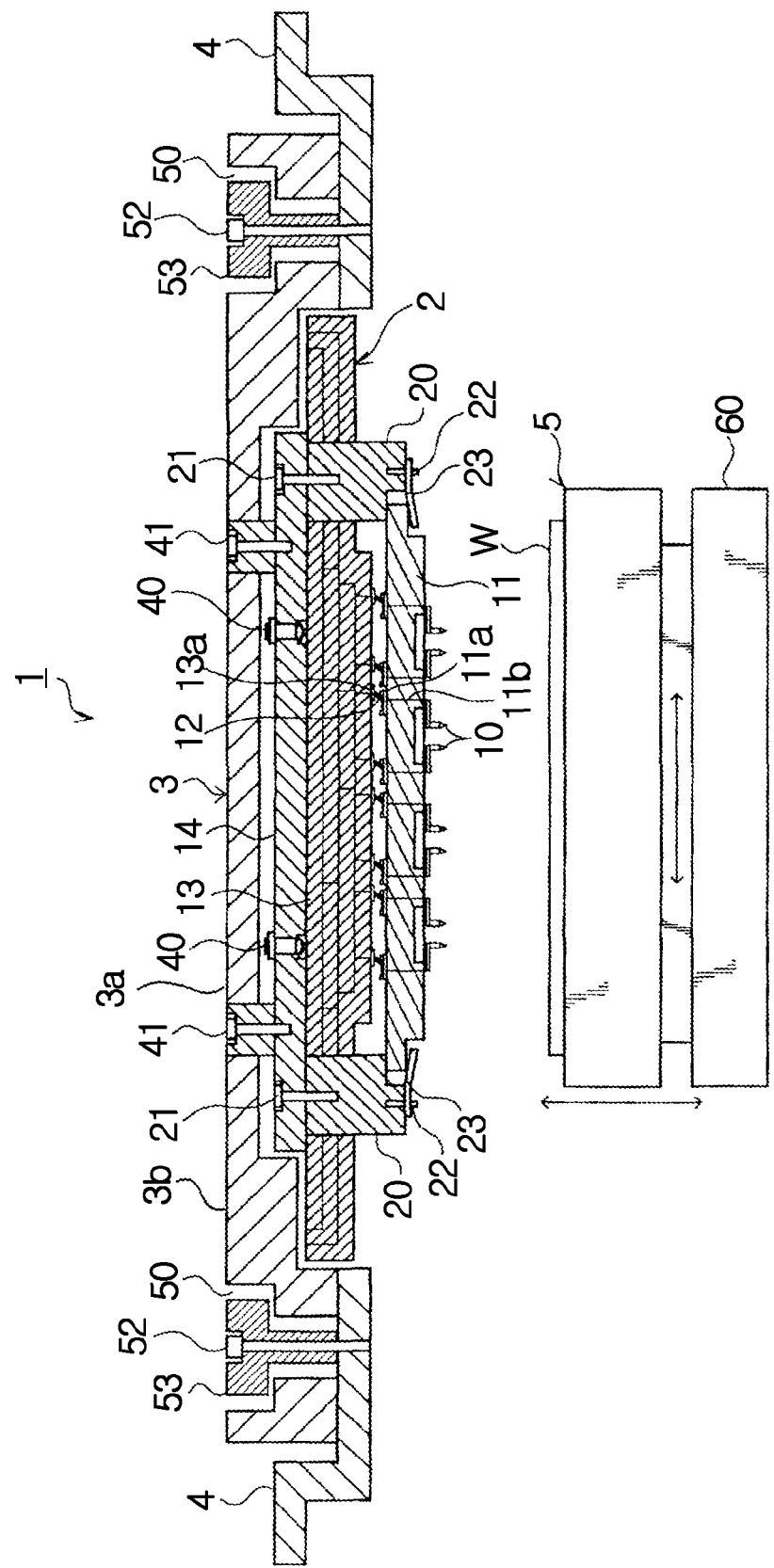
FIG. 1 is a longitudinal-sectional view schematically showing a structure of a probe device according to an embodiment of the present invention.

Embodiments of the present invention will now be described. FIG. 1 is a longitudinal-sectional view of the inside of a probe device 1 according to an embodiment of the present invention.

The probe device 1 includes, for example, a probe card 2, a reinforcing member 3 disposed at a top surface side of the probe card 2, and a card holder 4 for holding as a holding member an outer peripheral portion of the reinforcing member 3. The probe device 1 inspects electrical characteristics of an electronic circuit of a wafer W that is placed as an object to be inspected on a holding stage 5.

The probe card 2 is formed to have, for example, a nearly disk shape. The probe card 2 includes a support plate 11 for supporting a plurality of probes 10 acting as contactors, a printed wiring board 13 electrically connected as a circuit board to the support plate 11 by contact pins 12, and a correcting member 14 for correcting the degree of flatness of the support plate 11.

The support plate 11 is formed to have, for example, a nearly quadrangular plate shape, and is disposed at a bottom surface side of the probe card 2 to face the holding stage 5. The plurality of probes 10 arranged to correspond to a plurality of electrodes (not shown) of the wafer W are attached to and supported by a bottom surface of the support plate 11. Connection terminals 11a to which the contact pins 12 are attached are formed at a top surface of the support plate 11. The connection terminals 11a are connected to connection wires 11b that are formed in the inside of the support plate 11 and electrically conduct the probes 10 and the contact pins 12 disposed at the top surface side of the support plate 11. Also, the support plate 11 is formed of an insulating material having a coefficient of thermal expansion that is almost the same as that of the wafer W, for example, ceramic or glass.

The printed wiring board 13 is formed to have, for example, a nearly disk shape, and is disposed above the support plate 11 in parallel to the support plate 11. Connection terminals 13a contacting the contact pins 12 are formed on a bottom surface of the printed wiring board 13. The connection terminals 13a are connected to an electronic circuit that is formed in the inside of the printed wiring board 13 and transmits an electrical signal between a test head (not shown) and the support plate 11.

A gap having a predetermined width is formed between the printed wiring board 13 and the support plate 11, and the plurality of contact pins 12 for electrically connecting the support plate 11 and the printed wiring board 13 are formed in the gap. The contact pins 12 are arranged within the surface of the support plate 11 at almost regular intervals. The contact pins 12 are formed of a material having elasticity, flexibility, and conductivity, for example, nickel. Upper portions side of the contact pins 12 than portions of the printed wiring board 13 connected with the connection terminals 11a of the support plate 11 are bent toward the printed wiring board 13, so that upper end portions of the contact pins 12 are pressed to and brought into contact with the connection terminals 13a of the printed wiring board 13. The upper end portions of the contact pins 12 may freely move vertically and horizontally while being kept in contact with the printed wiring board 13.

The correcting member 14 has, for example, a nearly disk shape, and as shown in FIG. 1, is disposed at a top surface side of the printed wiring board 13 in parallel to the printed wiring board 13.

Connectors 20 for integrally connecting the support plate 11, the printed wiring board 13, and the correcting member 14 are fixed to a lower surface of an outer peripheral portion of the correcting member 14. The connectors 20 are fixed by, for example, bolts 21 that pass through the correcting member 14 in a thickness direction from a top surface side of the correcting member 14.

Each of the connectors 20 is formed to have a nearly rectangular prism shape that is long in a vertical direction. The connectors 20 are formed at a plurality of places, for example, 4 places, of an outer peripheral portion of the support plate 11. Each of the connectors 20 are arranged at regular intervals along the same circumference about a center of the support plate 11 when viewed from a plane.

The connectors 20 pass through, for example, the printed wiring board 13 in the thickness direction, so that lower end portions of the connectors 20 extend outside of the outer peripheral portion of the support plate 11. Leaf springs 23 are fixed to lower end surfaces of the connectors 20 by bolts 22. Due to the leaf springs 23, the outer peripheral portion of the support plate 11 is held upward and pushed toward the printed wiring board 13, thereby maintaining electrical contact between the support plate 11 and the printed wiring board 13.

Parallelism adjusting screws 40, for example, passing through the correcting member 14 in the thickness direction from the top surface side of the correcting member 14 and contacting the top surface of the printed wiring board 13, are formed in the correcting member 14. The parallelism adjusting screws 40 are formed at a plurality of places within the surface of the correcting member 14. The degree of flatness of the support plate 11 may be adjusted by rotating each of the parallelism adjusting screws 40 and adjusting a distance between each of the parallelism adjusting screws 40 and the top surface of the printed wiring board 13.

The reinforcing member 3 for reinforcing the printed wiring board 13 by covering, for example, the top surface of the probe card 2 is formed at the top surface side of the correcting member 14. The reinforcing member 3 supports the correcting member 14 by using a plurality of bolts 41. The card holder 4 mounted on a main body (not shown) of the probe device 1 and designed to support the outer peripheral portion of the reinforcing member 3 is formed on the outer peripheral portion of the reinforcing member 3.

Figure 2:
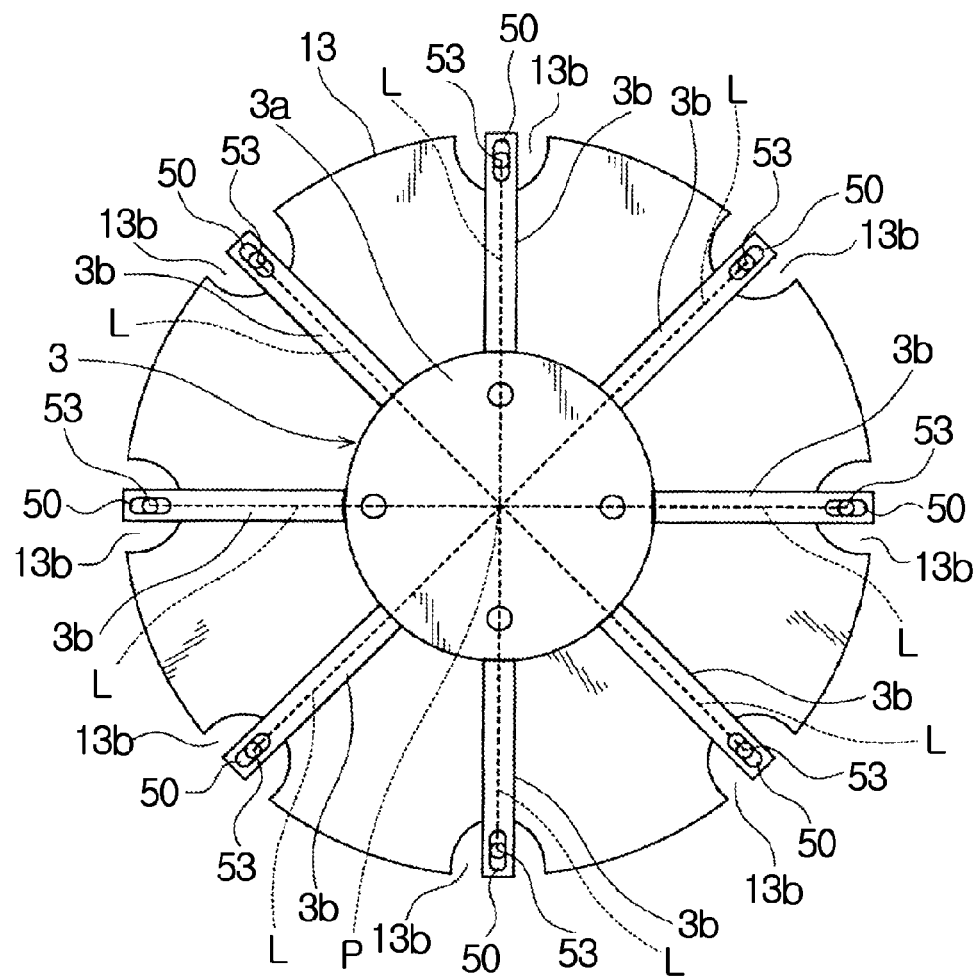
FIG. 2 is a top plan schematically showing structures of a reinforcing member and a printed circuit board of the probe device.

The reinforcing member 3, as shown in FIG. 2, includes a main body 3a having a nearly disk shape, and connection members 3b each having a nearly rectangular parallelepiped shape and extending in a diameter direction outwardly from an outer circumference of the main body 3a. The connection members 3b are formed, for example, in 8 places, and are disposed at regular intervals, that is, at intervals of 45 degrees, along the outer circumference of the main body 3a, that is along the same circumference about a center P of the reinforcing member 3. Also, the number of the connection members 3b is determined by a shape of a test head (not shown) connected to the printed wiring board 13 of the probe card 2. For example, 4 connection members 3b may be formed. In this case, the connection members 3b are disposed at 90-degree intervals along the same circumference about the center P of the reinforcing member 3.

Long guide holes 50 passing through the connection members 3b in the thickness direction are respectively formed in the connection members 3b. The guide holes 50 are formed to extend along the connection members 3b when viewed from the plane, that is, a central line L in a longitudinal direction of each of the guide holes 50 passes through the center P of the reinforcing member 3, so that a plurality of the central lines L intersect at the center P. Also, the guide holes 50 are formed at 45-degree intervals along the same circumference about the center P of the reinforcing member 3. Cut aways 13b each having a semicircular shape are formed on the printed wiring board 13, which is disposed under the connection members 3b in which guide holes 50 are formed, to surround the guide holes 50.

Figure 3:
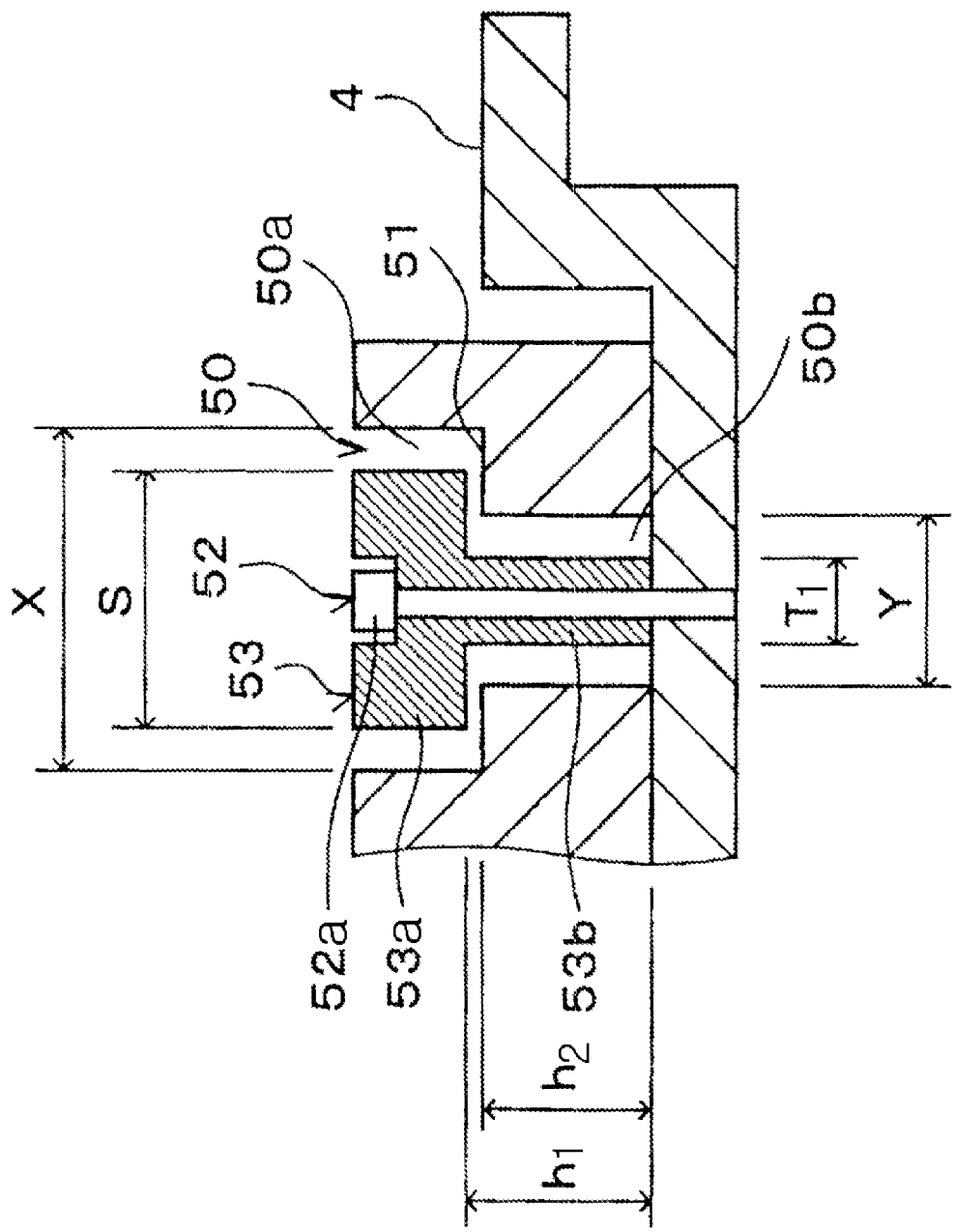
FIG. 3 is a longitudinal-sectional view schematically showing structures of elements around an outer peripheral portion of a reinforcing member of the probe device.

In the guide holes 50, as shown in FIG. 3, stepped portions 51 having lower portions protruding along inner circumferences of the guide holes 50 are respectively formed. In the guide holes 50, bolts 52 fixed as fixing members to the card holder 4 are formed. At the upper portions of the bolts 52, flange portions 52a are formed. Collars 53 are respectively formed around outer circumferences of the bolts 52, and are fixed to the card holder 4 by the bolts 52. The collars 53 include other flange portions 53a formed at upper portions thereof and support portions 53b formed at lower portion of the other flange portions 53a.

Figure 4:
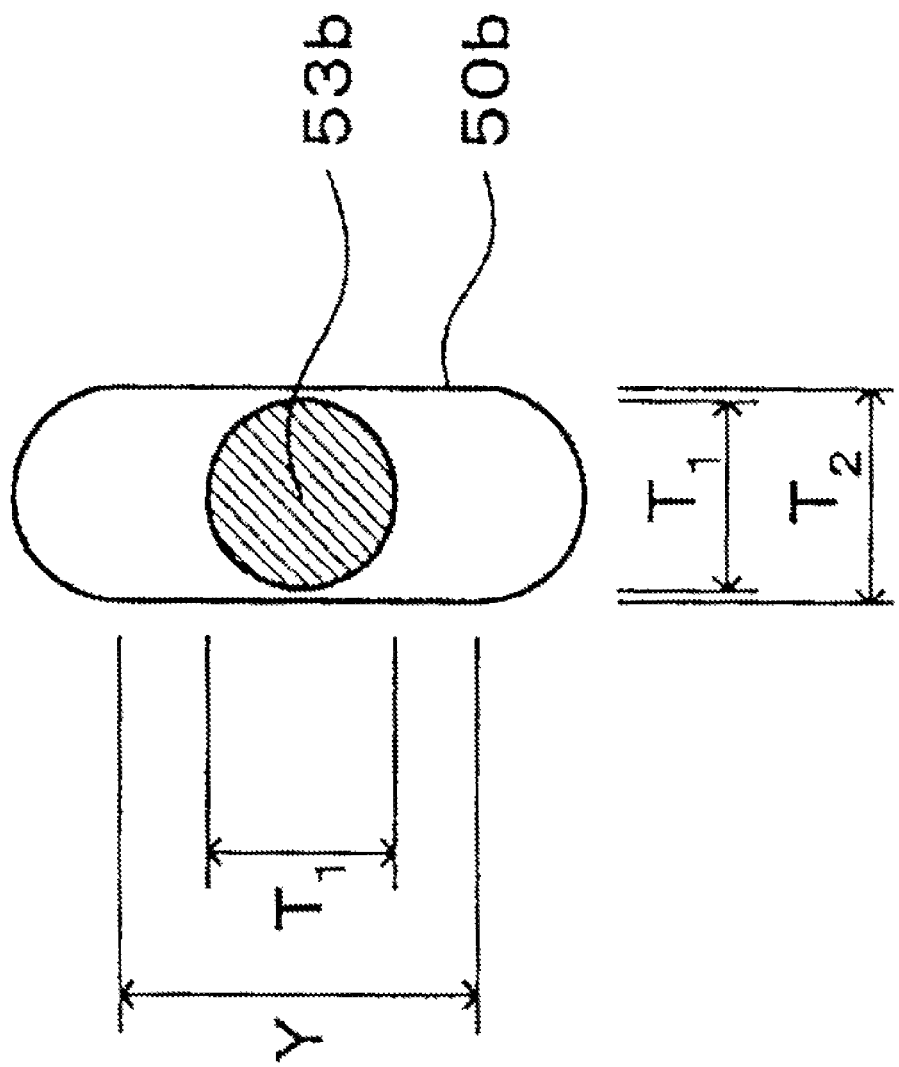
FIG. 4 is a plan view schematically showing structures of guide holes and support portions of collars.

The other flange portions 53a of the collars 53 are respectively formed above the stepped portions 51 to be spaced apart slightly from the stepped portions 51, for example, in such a manner that a distance $h_1$ between lower surfaces of the other flange portions 53a and upper surface of the card holder 4 is several μm greater than a distance $h_2$ between the stepped portions 51 and the upper surface of the card holder 4. Accordingly, although the bolts 52 are fastened, the outer peripheral portion of the reinforcing member 3 is not fixed correspondingly in the vertical direction. Also, a length X in a longitudinal direction of each of upper portions 50a than the stepped portions 51 of the guide holes 50 when viewed from a plane is greater than a diameter S of each of the other flange portions 53a, and a length Y in a longitudinal direction of each of lower portions 50b than the stepped portions 51 of the guide holes 50 when viewed from a plane is greater than a diameter $T_1$ of each of the support portions 53b. Accordingly, horizontal expansion of the reinforcing member 3 itself is allowed. Also, since the diameter S of each of the other flange portions 53a is greater than the length Y in the longitudinal direction of each of the lower portions 50b of the guide holes 50, getting loose of the reinforcing member 3 is suppressed. Also, the diameter $T_1$ of each of the support portions 53b of the collars 53, as shown in FIG. 4, may be slightly (several μm) less than a length $T_2$ in a transverse direction of each of the lower portions 50b of the guide holes 50.

The holding stage 5, as shown in FIG. 1, is constructed to be freely moved horizontally and vertically by a driving device 60, and may bring a desired portion of the wafer W into contact with each of the probes 10 by moving the wafer W placed thereon in a three-dimensional (3D) manner.

When electrical characteristics of the wafer W are inspected by using the probe device 1 constructed as described above, the wafer W is first placed on the holding stage 5. Next, for example, the holding stage 5 moves so that the wafer W comes close to the support plate 11 and each of the predetermined electrodes of the wafer W is brought into contact with each of the probes 10. And, an electrical inspection signal is transmitted to the wafer W through the printed wiring board 13, the support plate 11, and the probe 10, to inspect electrical characteristics of the electronic circuit of the wafer W.

In the above embodiments, since each of the guide holes 50 are formed by passing through the plurality of connection members 3b of the reinforcing member 3 in the thickness direction of the connection members 3b, the length X in the longitudinal direction of each of the upper portions 50a of the guide holes 50 is greater than the diameter S of each of the other flange portions 53a of the collars 53, and the length Y in the longitudinal direction of each of the lower portions 50b is greater than the diameter $T_1$ of each of the support portions 53a, horizontal expansion of the reinforcing member 3 itself is allowed. Also, since the other flange portions 53a of the collars 53 are respectively formed above the stepped portions 51 to be spaced apart slightly (several μm) from the stepped portions 51, the outer peripheral portion of the reinforcing member 3 is not fixed correspondingly in the vertical direction. Accordingly, at the time of inspecting the electrical characteristics of the wafer W, even though the temperature of the reinforcing member 3 is increased, the reinforcing member 3 can expand in a horizontal direction, thereby suppressing vertical deformation of the reinforcing member 3. Accordingly, since vertical deformation of the support plate 11 formed under the reinforcing member 3 is also suppressed, the heights of the plurality of probes 10 supported by the support plate 11 can be constantly maintained at predetermined heights. Accordingly, since contact between the probes 10 and the electrodes of the wafer W at the time of inspection can be stabilized, the electrical characteristics of the wafer W can be appropriately inspected.

Also, since the diameter S of each of the other flange portions 53a of the collars 53 is greater than the length Y in the longitudinal direction of each of the lower portions 50b of the guide holes 50, when the temperature of the reinforcing member 3 is increased and the reinforcing member 3 expands, becoming long and rising of the reinforcing member 3 can be suppressed.

Also, since the guide holes 50 are formed to extend along the connection members 3b, the central lines L in the longitudinal direction intersect at the center P of the reinforcing member 3, and the diameter $T_1$ of each of the support portions 53b of the collars 53 is slightly (several μm) less than the length $T_2$ in the transverse direction of each of the lower portions 50b of the guide holes 50, when the temperature of the reinforcement member 3 is increased and the reinforcing member 3 expands, the reinforcing member 3 can smoothly expand outwardly from the center P without being displaced from its central position. That is, the reinforcing member 3 can expand without being displaced in a rotational direction.

Although the bolts 52 and the collars 53 are formed in the guide holes 50 in the above embodiments, the collars 53 may be omitted and only the bolts 52 may be formed. In this case, the bolts 52 are formed in such a manner that a diameter of each of the flange portions 52a of the bolts 52 is less than the length X in the longitudinal direction of each of the upper portions 50a of the guide holes 50 and a diameter of each of lower portions than the flange portions 52a is less than the length Y in the longitudinal direction of each of the lower portions 50b of the guide holes 50. Although it is possible that the flange portions 52a of the bolts 52 are engaged with the stepped portions 51 of the guide holes 50, in this case, it is preferable to adjust the degree of fastening the bolts to an extent where the reinforcing member 3 can expand. In this case, when the temperature of the reinforcing member 3 is increased, horizontal expansion of a corresponding portion of the reinforcing member 3 itself is allowed.

In a case where the collars 53 are omitted as described above, the flange portions 52 of the bolts 52 may be additionally omitted. Even in this case, horizontal expansion of the corresponding portion of the reinforcing member 3 itself is allowed.

Figure 5:
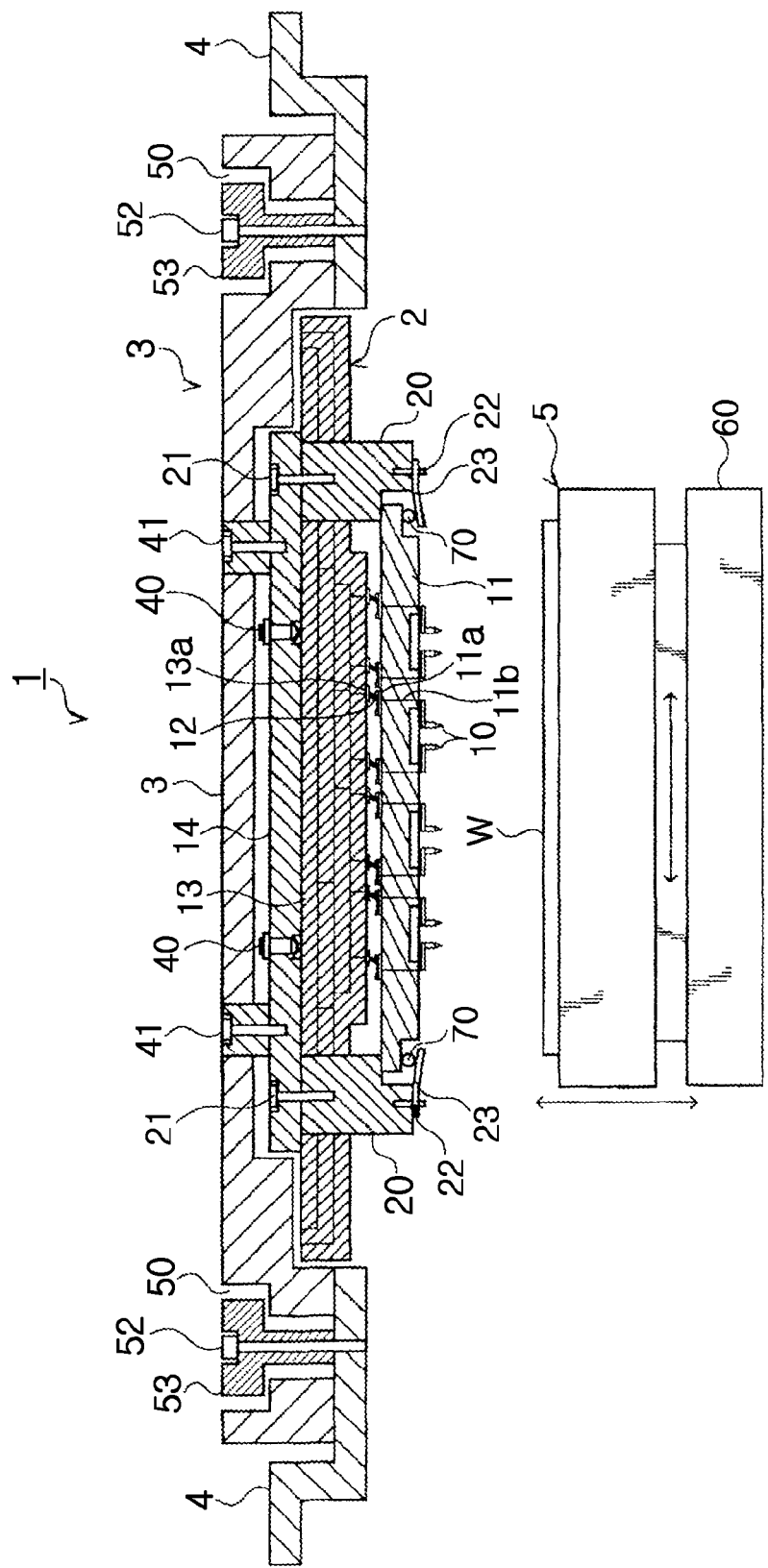
FIG. 5 is a longitudinal-sectional view schematically showing a structure of a probe device according to another embodiment of the present invention.
Figure 6:
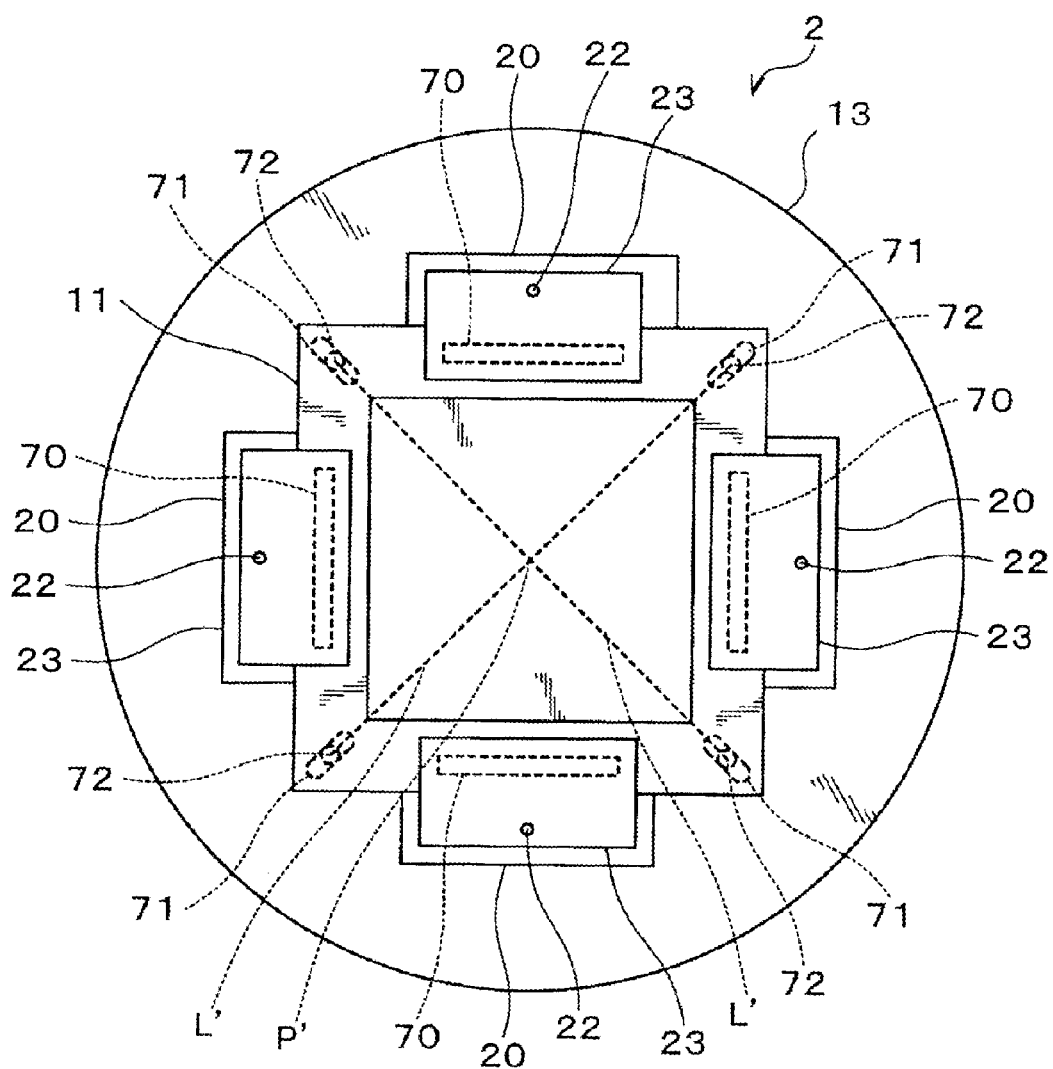
FIG. 6 is a bottom plan view of the probe card.

Although the leaf springs 23 directly hold the lower surface of the outer peripheral portion of the support plate 11 in the above embodiments, as shown in FIG. 5, rollers 70 may be formed between the leaf springs 23 and the lower surface of the outer peripheral portion of the support plate 11. The rollers 70, as shown in FIG. 6, extend in a direction perpendicular to a diameter direction of the support plate 11. Centers in longitudinal directions of the rollers 70 are arranged at regular intervals along the same circumference about a center P' of the support plate 11 when viewed from the plane. Due to the rollers 70, horizontal expansion of the support plate 11 itself is allowed and thus the support plate 11 is held by the leaf springs 23.

Here, for example, at the time of inspecting the electrical characteristics of the wafer W, when the temperature of the support plate 11 is increased, if the outer peripheral portion of the support plate 11 is fixed in the horizontal direction, a central portion of the support plate 11 may deform vertically upward, and the heights of the plurality of probes 10 supported by the support plate 11 become irregular, thereby making contact between the probes 10 and the electrodes of the wafer W unstable. However, in the above embodiments, since the rollers 70 are disposed between the lower surface of the outer peripheral portion of the support plate 11 and the leaf springs 23, horizontal expansion of the support plate 11 itself is allowed. Accordingly, even though the temperature of the support plate 11 is increased, the support plate 11 can expand in the horizontal direction. At this time, the rollers 70 rotate, and thus the support plate 11 can smoothly expand in the horizontal direction. Accordingly, since a corresponding portion of the support plate 11 can expand in the horizontal direction, vertical deformation of the support plate 11 can be suppressed. As a result, since the heights of the plurality of probes 10 supported by the support plate 11 can be constantly maintained at predetermined heights, contact between the probes 10 and the electrodes of the wafer W at the time of inspection can be stabilized.

Figure 7:
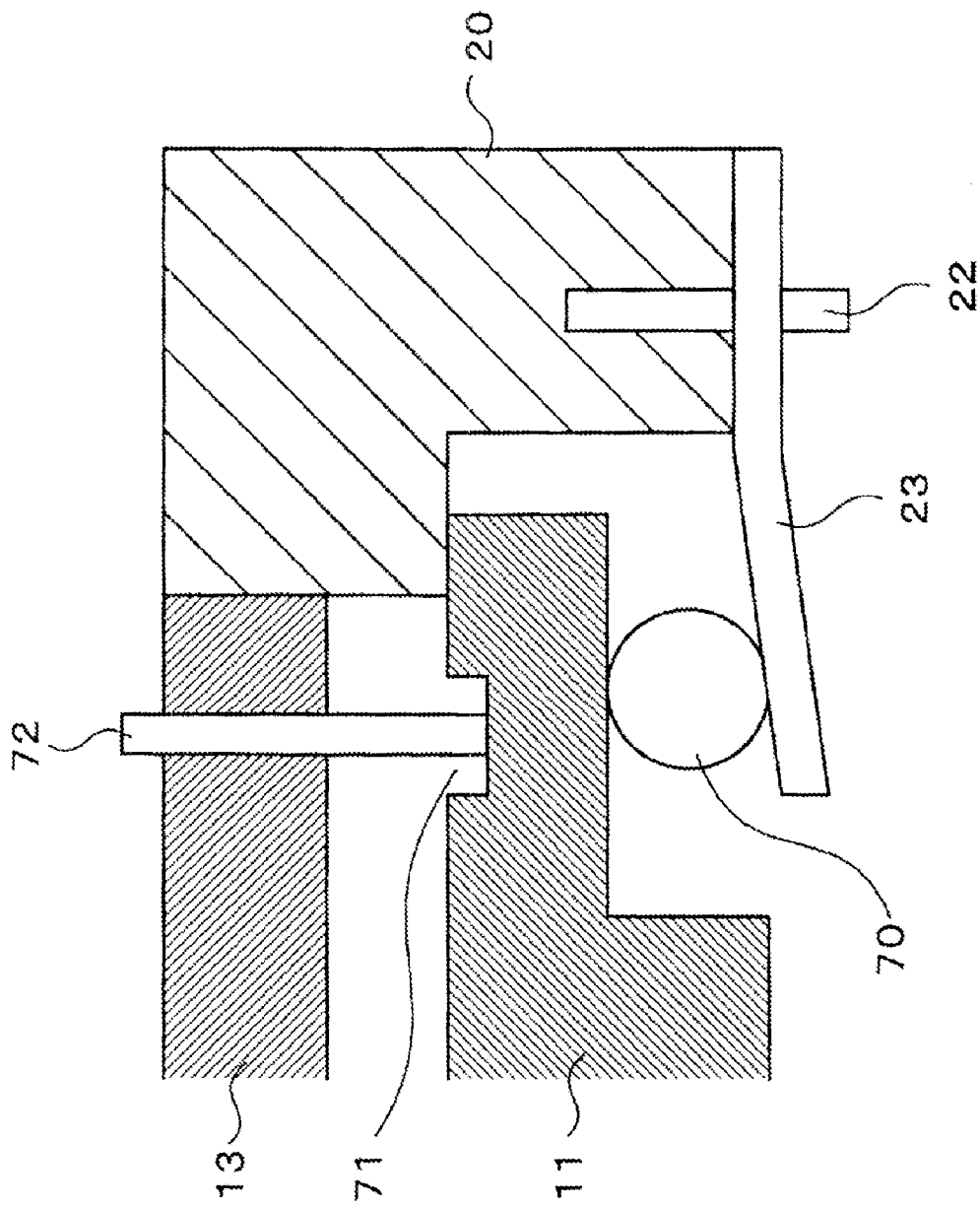
FIG. 7 is a longitudinal-sectional view schematically showing structures of elements around an outer peripheral portion of a support plate of the probe card.
Figure 8:
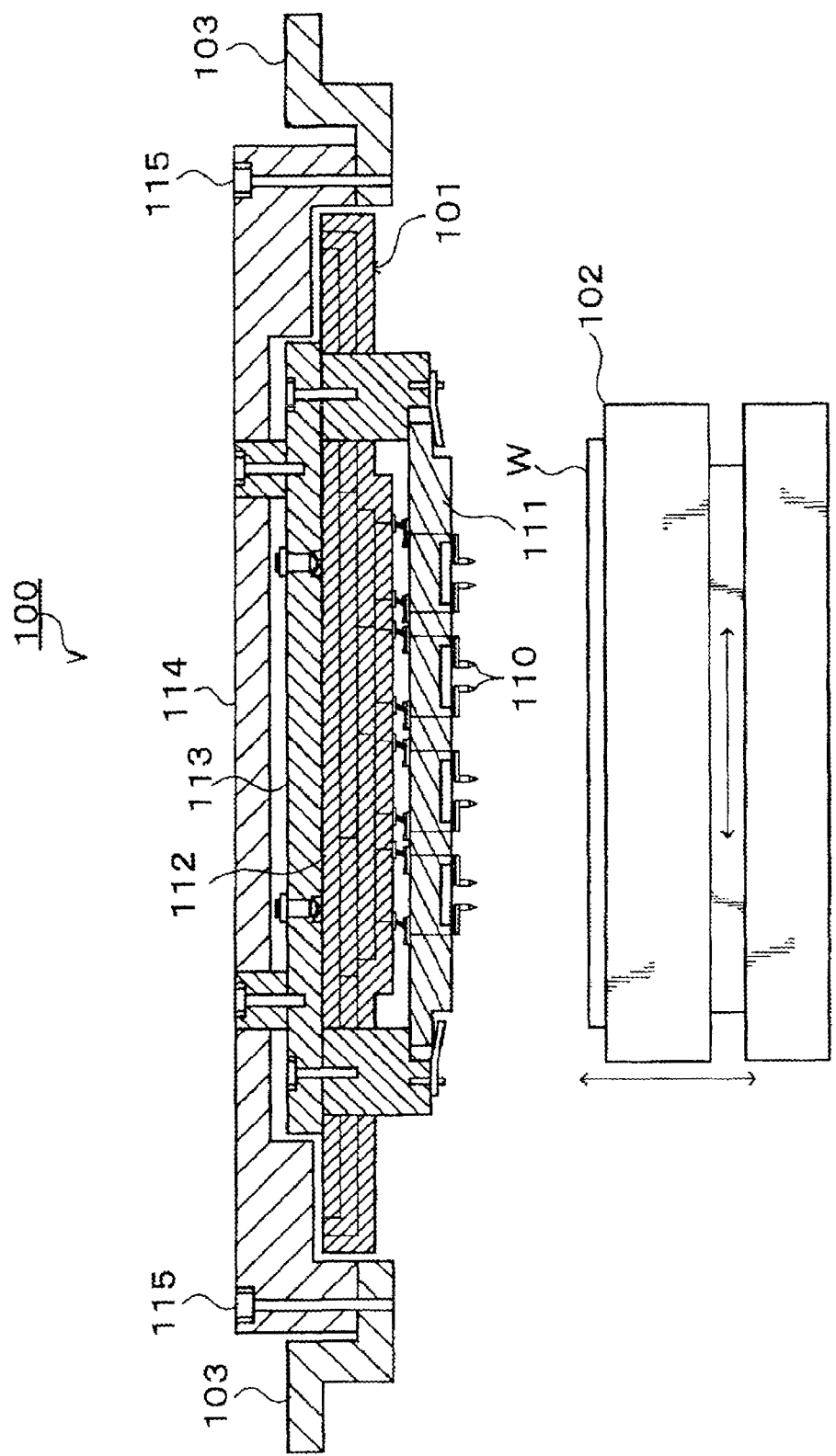
FIG. 8 is a longitudinal-sectional view schematically showing a structure of a conventional probe device.
Figure 9:
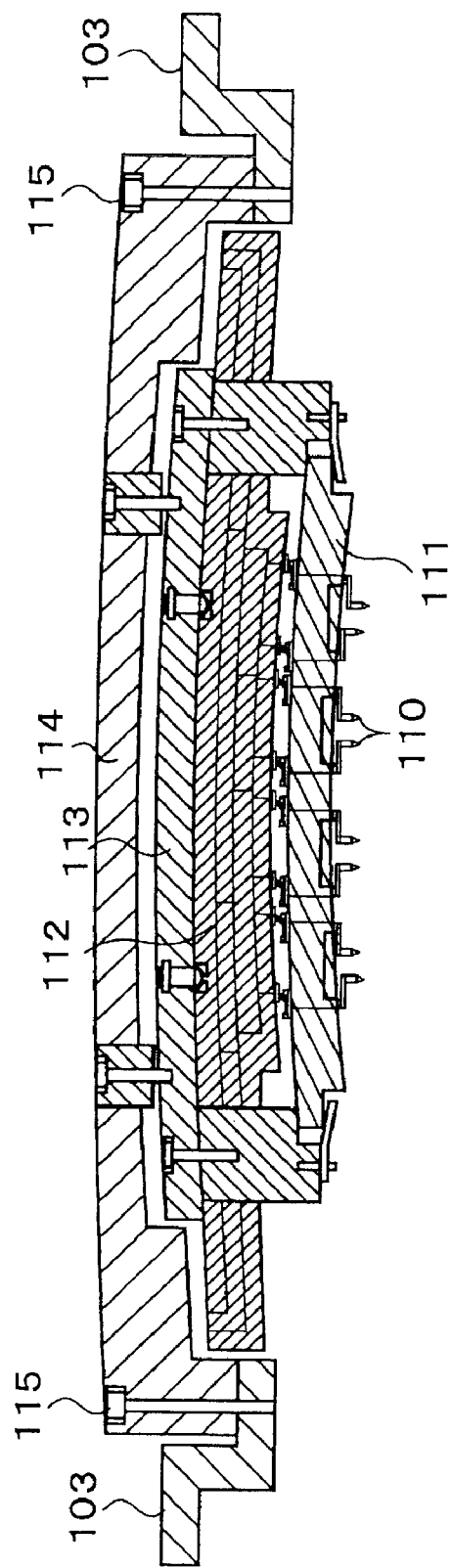
FIG. 9 is a longitudinal-sectional view showing a state where a reinforcing member of the conventional probe device deforms.

Also, in this embodiment, as shown in FIG. 6, guide grooves 71 for guiding horizontal extension and contraction of the support plate 11 may be formed in a plurality of places, for example, 4 places, of the top surface of the support plate 11. The guide grooves 71 are formed at 90-degree intervals along the same circumference about the center P' of the support plate 11. Each of the guide grooves 71 has a length in its longitudinal direction which is greater than a diameter of each of guide pins 72, and has a length in its transverse direction which is matched with the diameter of each of the guide pins 72, when viewed from the plane. A central line L' in the longitudinal direction of each of the guide grooves 71 passes through the center P' of the support plate 11. The guide pins 72, which pass through the printed wiring board 13 in the thickness direction, are inserted into the guide grooves 71 as shown in FIG. 7. Since the guide pins 72 pass through the printed wiring board 13 in the thickness direction, the guide pins 72 are fixed so as not to move in the horizontal direction.

Accordingly, since the length in the longitudinal direction of each of the guide grooves 71 is greater than the diameter of each of the guide pins 72, and the guide pins 72 fixed so as not to move in the horizontal direction by the printed wiring board 13 are inserted into the guide grooves 71, when the temperature of the support plate 11 is increased, the support plate 11 is guided by the guide grooves 71 and expands. Also, since the guide grooves 71 are formed at 90-degree intervals, and the central line L in the longitudinal direction of each of the guide grooves 71 passes through the center P' of the support plate 11, the support plate 11 can expand in the horizontal direction while being maintained in its central position. Accordingly, since the support plate 11 has a coefficient of thermal expansion that is substantially almost the same as that of the wafer W, and thus the support plate 11 expands in the horizontal direction almost in the same manner as the wafer W, horizontal positions of the electrodes of the wafer W with respect to the probes 10 supported by the support plate 11 are not changed, thereby enabling the probes 10 to appropriately contact the electrodes of the wafer W.

While the present invention has been particularly described with reference to appropriate embodiments thereof by referring to the attached drawings, it will be understood by those of ordinary skill in the art that various changes in form and details may be made therein without departing from the spirit and scope of the present invention as defined by the following claims. The present invention is not limited to the embodiments and may adopt various other types. The present invention may also be used even when a substrate is not a wafer but a substrate such as a mask reticle for photomask or an FPD (flat panel display).

INDUSTRIAL APPLICABILITY

The present invention is useful for a probe device for inspecting electrical characteristics of an object to be inspected such as a semiconductor wafer.

The invention claimed is:

1. A probe device which inspects electrical characteristics of an object to be inspected, the probe device comprising:
   a probe card comprising a support plate which supports a contactor that contacts the object to be inspected, and a circuit board disposed at a top surface side of the support plate;
   a reinforcing member having a part which is disposed at a top surface side of the circuit board and which reinforces the circuit board;
   a holding member which holds an outer peripheral portion of the reinforcing member,
   wherein fixing members are inserted into guide holes, and are fixed to the holding member,
   the guide holes are formed to pass through the outer peripheral portion of the reinforcing member in a thickness direction of the reinforcing member such that the guide holes guide the reinforcing member when the reinforcing member horizontally extends or contracts,
   a length in a longitudinal direction of each of the guide holes is greater than a diameter of each of the fixing members when viewed from a plane,
   a central line passing through a center of each of the guide holes in the longitudinal direction passes through a center of the reinforcing member when viewed from a plane, and in the guide holes, the outer peripheral portion of the reinforcing member is vertically spaced apart from the fixing members.

2. The probe device of claim 1, wherein each of the fixing members has a flange portion formed at an upper portion of each of the fixing members, and a stepped portion which engages the flange portion formed along an inner circumference of each of the guide holes.

3. The probe device of claim 1, wherein a collar is formed around an outer circumference of each of the fixing members, the collar has an other flange portion formed at an upper portion of the collar, a stepped portion which engages the other flange portion is formed along an inner circumference of each of the guide holes, and a distance between a lower surface of the other flange portion and an upper surface of the holding member is greater than a distance between the stepped portion and the upper surface of the holding member.

4. The probe device of claim 1, wherein the guide holes are formed at 45- or 90-degree intervals along a same circumference about the center of the reinforcing member when viewed from a plane.

* * * * *